United States Patent
Wang et al.

(10) Patent No.: US 7,601,215 B1
(45) Date of Patent: Oct. 13, 2009

(54) METHOD FOR RAPID, CONTROLLABLE GROWTH AND THICKNESS, OF EPITAXIAL SILICON FILMS

(75) Inventors: Qi Wang, Littleton, CO (US); Paul Stradins, Golden, CO (US); Charles Teplin, Boulder, CO (US); Howard M. Branz, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 11/560,886

(22) Filed: Nov. 17, 2006

(51) Int. Cl.
*C30B 15/20* (2006.01)

(52) U.S. Cl. .............................. 117/90; 117/89; 117/93; 117/105

(58) Field of Classification Search .................. 117/89, 117/90, 93, 105
See application file for complete search history.

(56) References Cited

U.S. PATENT DOCUMENTS

| | | | |
|---|---|---|---|
| 5,906,680 A | 5/1999 | Meyerson | |
| 6,210,991 B1 | 4/2001 | Wenham et al. | |
| 6,251,183 B1 | 6/2001 | Iwancizko et al. | |
| 6,506,451 B1 | 1/2003 | Stubhan et al. | |
| 6,638,839 B2 * | 10/2003 | Deng et al. | 438/485 |
| 6,755,151 B2 * | 6/2004 | Deng et al. | 118/723 HC |
| 6,902,973 B2 | 6/2005 | Chen et al. | |
| 6,908,866 B2 | 6/2005 | Chu et al. | |
| 6,974,750 B2 | 12/2005 | Haase | |
| 7,033,637 B1 | 4/2006 | Hunt et al. | |
| 7,049,230 B2 | 5/2006 | Park | |
| 2003/0045075 A1 | 3/2003 | Joo et al. | |
| 2003/0183270 A1 | 10/2003 | Falk et al. | |
| 2004/0152287 A1 * | 8/2004 | Sherrill et al. | 438/485 |
| 2006/0208257 A1 * | 9/2006 | Branz et al. | 257/49 |

OTHER PUBLICATIONS

M. Schluter, et al., Self-consistent pseudopotential calculations fi Si (111) surfaces: Unreconstructed {1x1} and reconstructed (2x1) model structures*, Physical Review B, V 12, 10, pp. 4200-4214, Nov. 1975.

J. Thiesen, et al., Explanation of the limiting thickness observed in low-temperature silicon epitaxy, Appl Phys Ltrs, V 77, 22, pp. 3589-3591, Nov. 2000.

J.A. Roth, et al., Kinetics of solid phase epitaxy in thick amorphous Si layers formed by MeV ion implantation, Appl. Phys. Ltrs, 57, 13, pp. 1340-1342, Sep. 1990.

(Continued)

*Primary Examiner*—Felisa C Hiteshew
(74) *Attorney, Agent, or Firm*—Paul J. White; Mark D. Trenner; John C. Stolpa (57) ABSTRACT

A method of producing epitaxial silicon films on a c-Si wafer substrate using hot wire chemical vapor deposition by controlling the rate of silicon deposition in a temperature range that spans the transition from a monohydride to a hydrogen free silicon surface in a vacuum, to obtain phase-pure epitaxial silicon film of increased thickness is disclosed. The method includes placing a c-Si substrate in a HWCVD reactor chamber. The method also includes supplying a gas containing silicon at a sufficient rate into the reaction chamber to interact with the substrate to deposit a layer containing silicon thereon at a predefined growth rate to obtain phase-pure epitaxial silicon film of increased thickness.

26 Claims, 7 Drawing Sheets

OTHER PUBLICATIONS

H.R. Moutinho, et al., How deposition parameters control growth dynamics of nc-Si deposited y hot-wire chemical vapor deposition, J Vac Sci Technol, A 24, 1, pp. 95-102, Jan./Feb. 2006.

T.J. Donahue, et al., Silicon epitaxy at 650-800 C using low-pressure chemical vapor deposition both with and without plasma enhancement, J Appl Phys, 57, 8, pp. 2757-2765, Apr. 1985.

J. Platen, et al., Low-temperature epitaxial growth of Si by electron cyclotron resonance chemical vapor deposition, Thin Solid Films, 381, pp. 22-30, 2001.

P. Stradins, et al., Physics of Solid-Phase Epitaxy of Hydrogenated Amorphous Silican for Thin Film Si Photovoltaics, Mater Res Symp Proc, 910, pp. 365-370, 2006.

C.E. Richardson, et al., Hot-wire CVD-grown epitaxial Si films on Si (100) substrates and a model of epitaxial breakdown, Thin Solid Films, 501, pp. 332-334, 2006.

J. Dabrowski, et al., Atomic Structure of Clean Si(113) Surfaces: Theory and Experiment, Phys Rev Ltrs, V 73, 12, pp. 1660-1663, Sep. 1994.

J.J. Boland, Role of hydrogen desorption in the chemical-vapor deposition of Si (100) epitaxial films using disilane, Phys Rev B, V 44, 3, pp. 1383-1386, Jul. 1991.

C.W. Teplin, et al., Roughness, Impurities and Strain in Low-Temperature Epitaxial Silicon Films Grown by Tantalum Filament Hot-Wire Chemical Vapor Deposition, Mater Res Symp Proc, 910, pp. 343-352, 2006.

Chevrier et al., Epitaxial growth of Fe-Si compounds on the silicon (111) face, The American Physical Society, Feb. 24, 1992, 15,946-15,954, vol. 46, No. 24.

Deboer et al., Low temperature epitaxial . . . electron-cyclotron-resonance plasma deposition, American Institute of Physics, May 8, 1995, 2528-2530, vol. 66, No. 19.

Aiken et al., Alternative Contact Designs for Thin Epitaxial Silicon Solar Cells, Progress in Photovoltaics: Research and Applications, Dec. 17, 1998, 275-285.

* cited by examiner

METHOD FOR RAPID, CONTROLLABLE GROWTH AND THICKNESS, OF EPITAXIAL SILICON FILMS

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

TECHNICAL FIELD

The described subject matter relates to the growth of epitaxial Si to suitable thicknesses at low temperatures and low cost.

BACKGROUND

The present process relates to an exemplary method for fast growth (over 100 nm/m) and thickness (over 10 micron) of epitaxial Si at substrate temperatures above 570° C., or above the surface dehydrogenation temperature of the silicon surface, but less than 700° C. at base pressure, preferably about $10^{-6}$ Torr, using hot wire chemical vapor deposition (HWCVD). The film produced is used primarily for photovoltaic applications; however, these epitaxial Si films are also applicable to other semiconductor devices. The surface morphology can be controlled during the growth from smooth to a pyramidal shape, which is ideal for light trapping in film—Si photovoltaics. Further, the method of growth of epitaxial Si is possible with undoped, n- and p-type doping and on several orientations of the substrate crystalline silicon (c-Si), including the difficult <111> surface or face.

U.S. Pat. No. 6,210,991 B1 discloses Al induced epitaxial growth of Si at elevated temperature to make a thin (<1 micron), heavily-doped contact to c-Si. In this epitaxial growth, Al diffuses thru Si and makes c-Si.

The growth of a diamond-like carbon film using controlled nuclei is disclosed in U.S. Pat. No. 6,506,451 using the growth technique of hot-wire CVD.

U.S. Pat. No. 6,902,973 discloses hemi-spherical grain silicon enhancement by forming epitaxial silicon on hemi-spherical grain Si for a semiconductor device. The epitaxial Si film was formed by a multi-step, multi-gas thermal CVD process at high temperature from 750° C. to 900° C. The thickness is only about 10 nm and the localized epi-Si growth is used to form small size grains.

Epitaxial and polycrystalline growth of Si 1-x-y GexCx and Si 1-xCy alloy layers on a Si by UHV-CVD is disclosed in U.S. Pat. No. 6,908,866. In particular, the process relates to heteroepitaxial growth of Si—C and SiGe—C on c-Si growth by Ultra-High Vacuum (below $10^{-8}$ Torr) CVD at low temperatures (475° C.-850° C.). The method is limited to a certain thickness of epitaxial growth of less than 1 micron before epitaxy breaks down into polycrystalline growth.

U.S. Pat. No. 5,906,680 discloses CVD silicon epitaxy and its growth system requires a temperature (800° C.) that would melt borosilicate and other glasses at its low base pressure of about $10^{-9}$ Torr.

A process for forming a trench power MOS device suitable for large diameter wafers is disclosed in U.S. Pat. No. 6,974,750B2. The process includes the use of a standard high temperature (~800° C.-1200° C.) CVD epitaxial growth of c-Si from $SiH_4$-over a 6 inch c-Si wafer to form a trench power MOS. This epitaxy step is at high temperature, and quite standard.

A method of forming a contact plug in a semiconductor device is disclosed in U.S. Pat. No. 7,049,230. The method entails heat treatment of deposited amorphous Si into epitaxial Si, namely solid phase epitaxial (SPE) growth at 550° C.~650° C. to produce epitaxial layers less than 0.2 microns thick.

U.S. Patent Application 2003/0045075 discloses a method of selective epitaxial growth for semiconductor devices, which was an improved selective epitaxial growth using a cyclical approach, in which epitaxial growth has been interrupted periodically. The epitaxy is done at 750° C. by CVD, with various gases used in selective etching through a mask layer.

De Boer et al. in "Low Temperature Epitaxial Silicon Film Growth Using High Vacuum Electron-Cyclotron-Resonance Plasma Deposition," *Appl. Phys Lett.* 66(19), 8 May 1995, Pages 2528-2530 discloses epitaxial Si growth at low temperature for a maximum of about 2 microns using electron-cyclotron-resonance (ECR-CVD) plasma deposition in a system with a base pressure of just below $10^7$ Torr and at low temperatures (450° C.-525° C.).

U.S. Pat. No. 6,251,183 discloses a process for depositing an epitaxial layer on a crystalline substrate, comprising providing a chamber having an element capable of heating, introducing the substrate into the chamber, heating the element at a temperature sufficient to decompose a source gas, passing the source gas in contact with the element, and forming an epitaxial layer on the substrate. The low temperature region in this process is below 400° C. and no reference to the use of a temperature above 600° C. is disclosed.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with apparatus and methods which are meant to be exemplary and illustrative, not limiting in scope. In various embodiments, one or more of the described problems have been reduced or eliminated, while other embodiments are directed to other improvements.

An order of magnitude increase in both the rate and achievable thickness of epitaxy by hot-wire chemical vapor deposition (HWCVD) at temperatures above the dehydrogenation temperature of the silicon surface is observed. By depositing silicon films on <100> silicon at 110 nm/min, at substrate temperatures above 570° C., especially at the glass compatible temperature of 610° C., a phase-pure epitaxial silicon film growth to more than 10 µm (e.g., up to about 11 µm) is observed by x-ray diffraction (XRD) and transmission electron microscopy (TEM), in contrast to the mixed-phase breakdown seen at lower temperatures. In 610° C. films thicker than 4 µm, a stable <100>-epitaxial growth mode produces regular surface pyramids with vicinal <311> facets. On the high-energy <111> face of Si, more than 2 µm of epitaxial Si were grown at 645° C., but some twinning is observed. The temperature of this growth regime shows that rapid dehydrogenation of the growing surface for silicon epitaxy by HWCVD is obtained.

An exemplary method of producing epitaxial silicon films on a c-Si surface using HWCVD by controlling the rate of silicon deposition above the temperature of dehydrogenation of the surface to obtain a phase-pure epitaxial silicon film may comprise placing a sample with a c-Si surface, being the low energy <111> face of Si, within an orientation in a HWCVD reactor chamber; providing a deposition temperature above the monohydride to a silicon-free hydrogen (H) surface transition temperature of about 570° C. to about 700° C.; and reacting a gas containing silicon on the hot filament at a sufficient rate to interact with the substrate to deposit a layer containing silicon thereon at a growth rate of about 110 nm/min to obtain a phase-pure epitaxial silicon film of increased thickness. In the exemplary method the preferred rate of supplying the gas containing silicon is about 20 sccm.

It will be appreciated by those skilled in the art that the c-Si surface may consist of a surface of single crystal Si, a surface of polycrystalline Si wafers or a surface of polycrystalline Si films or polycrystalline Si films on a Si substrate. Additionally, the deposition temperature is sufficient to exceed the transition from a monohydride to a silicon-free hydrogen surface at about 570° C. The teachings of this exemplary method demonstrate that an epitaxial silicon film up to 11 μm on a c-Si wafer <100> silicon can be produced. Moreover, we have demonstrated that an epitaxial silicon film up to 2 μm on a c-Si wafer <111> silicon can be produced. Finally, we have observed that the exemplary method produces an uneven surface and reduces reflectivity and increases light absorption in the epitaxy layer.

Another exemplary method of producing epitaxial silicon films on a c-Si surface that is a thin Si layer on glass using HWCVD by controlling the rate of silicon deposition above the temperature of dehydrogeneration of the surface to obtain a phase-pure epitaxial silicon film may comprise placing a sample with a c-Si surface of some orientation as a thin Si layer on borosilicate glass in a HWCVD reactor chamber; providing a deposition temperature above the monohydride to a silicon-free hydrogen surface transition temperature of about 570° C. to about 700° C. and reacting gas containing silicon on the hot filament at a sufficient rate to interact with said thin Si layer substrate to deposit a seed layer (of about 200 nm) containing silicon thereon at a growth rate of about 110 nm/min to obtain phase-pure epitaxial silicon film of increased thickness.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in the reference figures of the drawings. It is intended that the embodiments and figures disclosed herein are to be considered illustrative rather than limiting.

DETAILED DESCRIPTION

Films were grown on c-Si wafer substrates by HWCVD which is a process for depositing material films over large areas. A 0.51-mm-diameter tungsten filament 5 cm from the substrate was heated to 2100° C.±100° C. with a 16 amps (A) current to crack pure $SiH_4$ gas molecules into reactive radicals for deposition. A pressure of 9 mTorr and a $SiH_4$ gas flow rate, or rate of supplying gas of 20 sccm was used for all depositions, resulting in a growth rate of approximately 110 nm/min. Before deposition, the reactor base pressure was 2 to $5 \times 10^{-6}$ Torr. The c-Si substrate or surface material was mounted upside down on a tantalum-wire based heater. Both n-type antimony dopant (Sb dopant) and p-type boron dopant (B dopant) wafers were used, with resistivities between 1.5 and 0.005 Ω-cm, with no obvious differences in the progress of epitaxy. After dicing to $2.5 \times 2.5$ cm$^2$, the wafer substrates were cleaned with a modified RCA procedure, see: C. W. Teplin, M. Page, et al., *Mat. Res. Soc. Symp. Proc.* (in press). Immediately before being loaded into the HWCVD reactor, the substrates were dipped in a 5% HF solution to strip the native oxide.

The substrate temperature was monitored using a thermocouple touching the back of the substrate; the thermocouple was calibrated using an optical pyrometer measuring the film surface. The substrate temperatures reported were accurate to ±15° C. At, near or above about 600° C., additional film growth was expected due to direct thermal decomposition of $SiH_4$ on the substrate, see: T. Donahue and R. Reif, *J. Appl. Phys.* 57, 2757 (1985), and we measured this deposition rate by growing a film with identical deposition parameters, but without heating the filament wire. A growth rate of ~3 nm/min was observed, consistent with previous studies of thermal CVD, see: T. Donahue and R. Reif, *J. Appl. Phys.* 57, 2757 (1985); this small CVD growth rate implies that HWCVD deposition is dominated by surface reactions with silane radicals produced by hot-wire-driven gas-phase chemistry.

After growth, the samples were removed from the chamber and analyzed using a XRD (Bruker D2000), SEM, and optical reflectance. The total reflectance of rough films was obtained using an integrating sphere. Selected films were chosen for TEM analysis (Phillips CM30).

Figure 1:
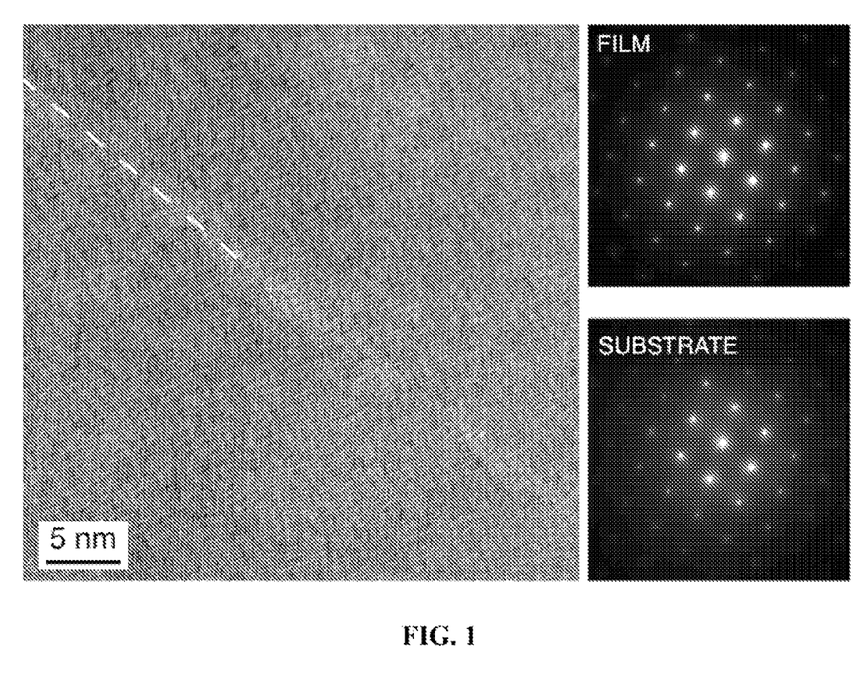
FIG. 1 shows a TEM image of the interface of silicon film deposited at 610° C. on a <100> 1.5Ωcm n-type Si wafer.

FIG. 1 shows a TEM image of the interface of silicon film deposited at 610° C. on a <100> 1.5 Ω-cm n-type Si wafer. The substrate/film interface is marked with a dashed white line. Both the presence of lattice planes running through the interface and the identical selected area diffraction patterns from the film and substrate (right-hand side of FIG. 1) confirm that the film is epitaxial.

Figure 2:
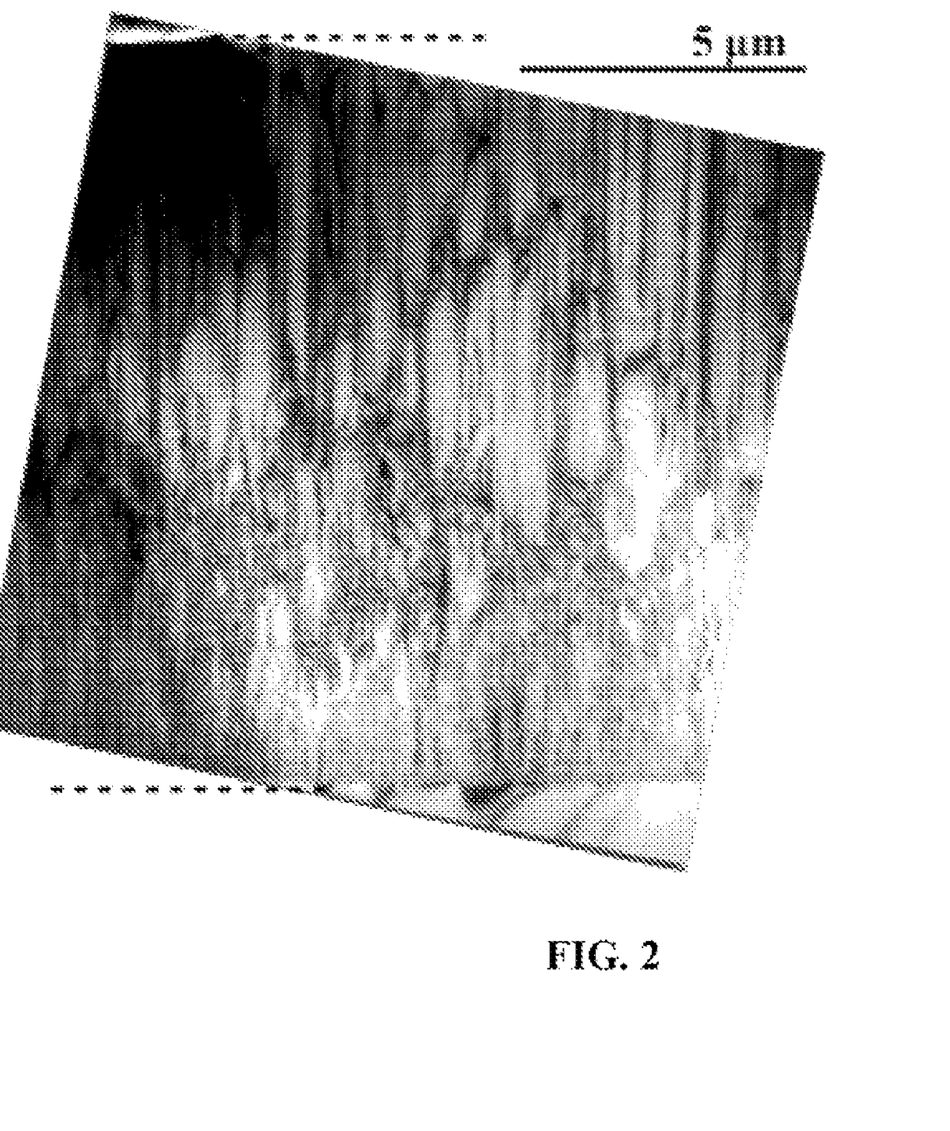
FIG. 2 is a TEM image of a second film grown under identical conditions, but to a thickness of 11 μm.
Figure 3A:
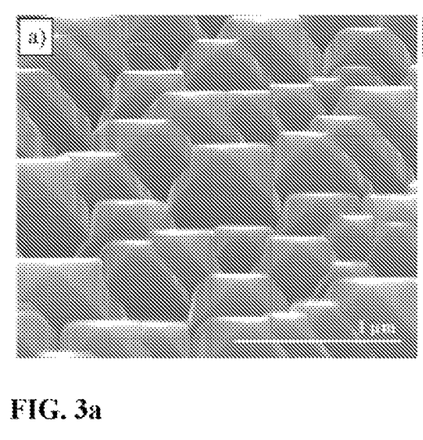
FIG. 3a is a SEM image of the surface of this film that shows microstructures having pyramid-shaped growth fronts.
Figure 3B:
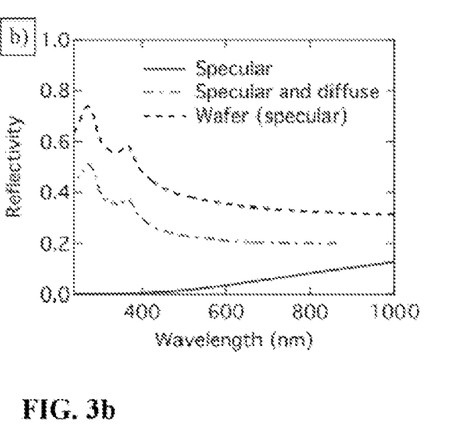
FIG. 3b is a graph showing reflectivity versus wavelength and depicts the large effective roughness caused by this microstructure formation that dramatically reduces the specular and total reflectivity of the films.

A TEM image of a second film grown under identical conditions, but to a thickness of up to about 11 μm, is shown in FIG. 2. The area shown in the image is entirely epitaxial. After about 4 μm of growth, columnar shaped microstructures form which are about ~0.5 μm wide and have far fewer defects visible in TEM. An SEM image of the surface of this film (FIG. 3a) shows that these microstructures have pyramid-shaped growth fronts. The uniform in-plane alignment of these pyramids is another indication of epitaxial growth through the entire film thickness. Using AFM measurements of this surface, we determined that each facet makes an angle of 26°±5° with the sample normal, indicating that the facets are vicinal <311> planes. The continued growth of the roughened surface shows that the epitaxy on the <311> surface is possible by this technique. The reconstructed Si <311> surface is a low-energy surface, see J. Dabrowski, H. Mussig and G. Wolff, *Phys. Rev. Lett.* 73, 1660 (1994), and is reached at a lower angle (surface roughness) than the even more stable <111> surface. The large effective roughness caused by this microstructure formation dramatically reduces the specular and total reflectivity of the films, as shown in FIG. 3b. The film appears rough upon visual inspection.

Figure 4:
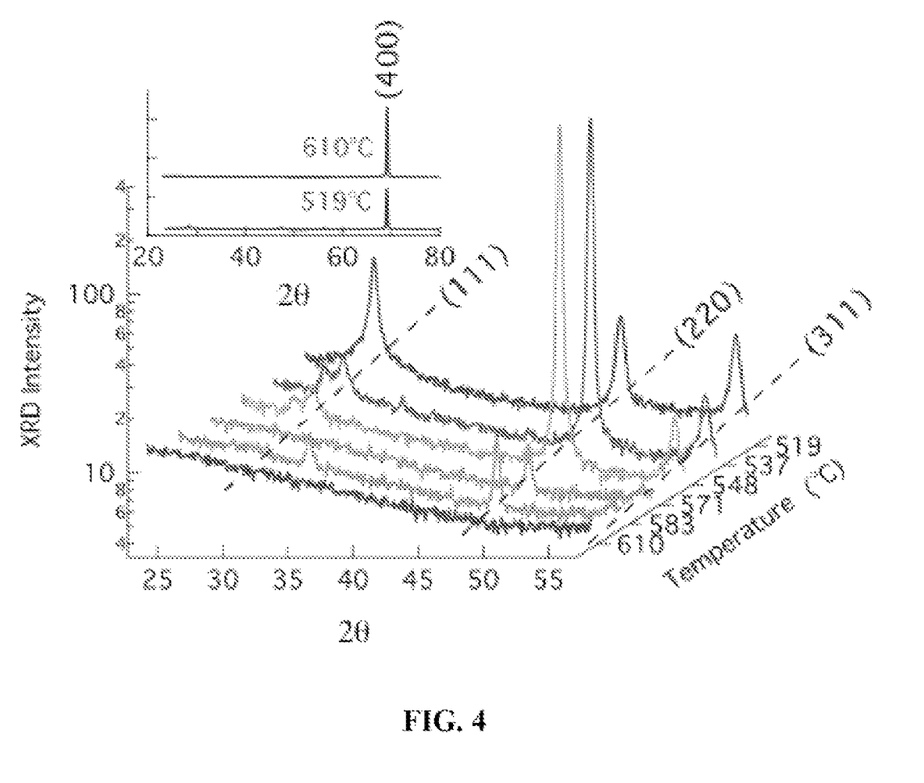
FIG. 4 shows the XRD analysis of the temperature (T) dependence of the crystalline phase of the film growth, where a series of 2 μm thick films were grown onto <100> 1.5 Ωcm n-type c-Si substrates at temperatures between 519° C. and 610° C.

To study the T-dependence of the crystalline phase of the film growth, a series of 2 μm thick films were grown onto <100> 1.5 Ω-cm n-type c-Si substrates at temperatures between 519° C. and 610° C. XRD analysis of these films is shown in FIG. 4. The inset of FIG. 4 shows the entire XRD spectrum (linear scale) of the films grown at the highest and lowest temperatures. The dominant peak in the XRD spectra at all temperatures is the (400) silicon peak at 69.1° C., with contributions from both the <100> substrate and, at some temperatures, from <100> epitaxy. The main panel of FIG. 4 expands the 25°<2Θ<55° XRD spectra. A perfect epitaxial film would show no peaks at these angles, as observed in the film grown at 610° C. The films grown at lower temperatures all show XRD peaks other than the (400), indicating some degree of epitaxy failure. The films grown at 571° C. and 583° C. have small (220) peaks. However, their (400) peaks are comparable to that of the 610° C. layer and the SEM images of the surfaces are quite smooth. Thus, it is likely that epitaxy began to fail only near the end of growth, but that significant epitaxy is possible above 570° C. In the film grown at 583° C., there is also a small peak near 33°, roughly the location of the symmetry-forbidden (200) peak. The intensity of this peak varies dramatically with the in-plane orientation of the sample during the XRD measurements, and is also observed in certain XRD spectra of the sample grown at 571° C. This peak likely appears because some defect (e.g., twinning) has broken the symmetry of the silicon structure during epitaxy. At 548° C. and 537° C., the XRD spectra indicate that epitaxy has failed after some thickness and the subsequent growth is dominated by (220)-oriented grains. Preferential (220)-oriented growth is also found in microcrystalline silicon films grown by HWCVD from H-diluted silane, see: H. Moutinho, B. To, et al., *J. Vac. Sci. Tech. A* 24, 95 (2006). At the lowest temperature, 519° C., all of the silicon peaks are present, indicating epitaxy failure and growth of randomly oriented polycrystalline silicon.

Figure 5:
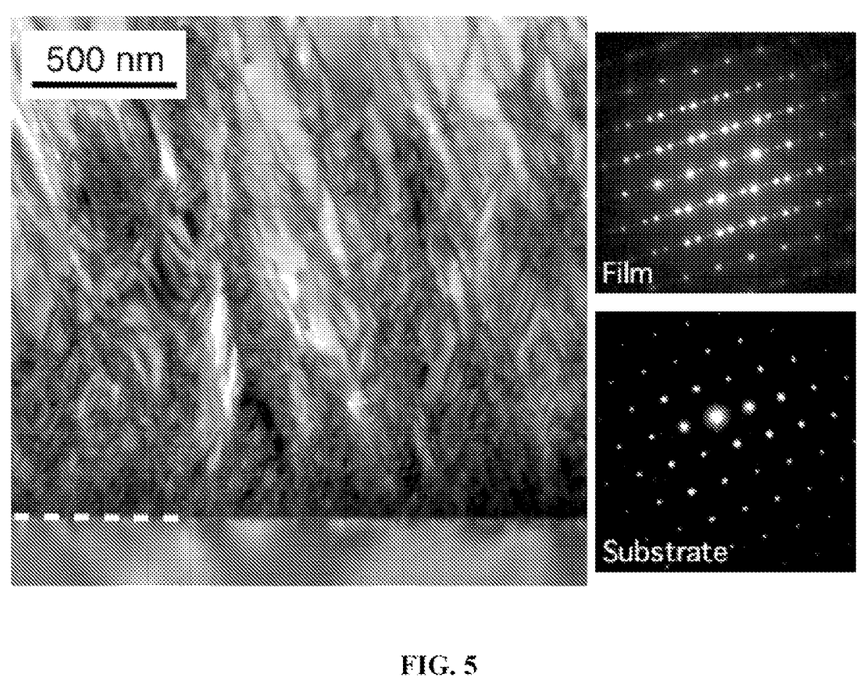
FIG. 5 shows a TEM image of 2 μm of epitaxial Si on a <111> 0.2 Ω-cm p-type Si wafer at 645° C.

2 μm of epitaxial Si was grown on <111> 0.2 Ω-cm p-type Si wafer at 645° C. XRD (not shown) reveals no peaks other than the silicon <111> peak. FIG. 5 shows a TEM image of this film. The TEM analysis reveals many more structural defects than were observed in the epitaxial layer grown on a <100> substrate at a temperature of 610° C. (FIG. 1). Additional reflections in the selected area diffraction pattern (right-hand side of FIG. 5) indicate the presence of twinning. High-resolution TEM images reveal lattice planes running through the substrate/film interface, confirming that the initial growth is entirely epitaxial. Previous research showed that <111> epitaxy is more challenging than other orientations, see: J. Platen, B. Selle, I. Sieber, S. Brehme, U. Zeimer and W. Fuhs, *Thin Solid Films* 381, 22 (2001), consistent with the low <111> surface energy, see: M. Schluter, J. Chelikowsky, S. Louie and M. Cohen, *Phys. Rev.* B 12, 4200 (1975). Thus, successful epitaxy on both <100> and <111> wafers indicates that HWCVD epitaxy is robust above 600° C.

Figure 6:
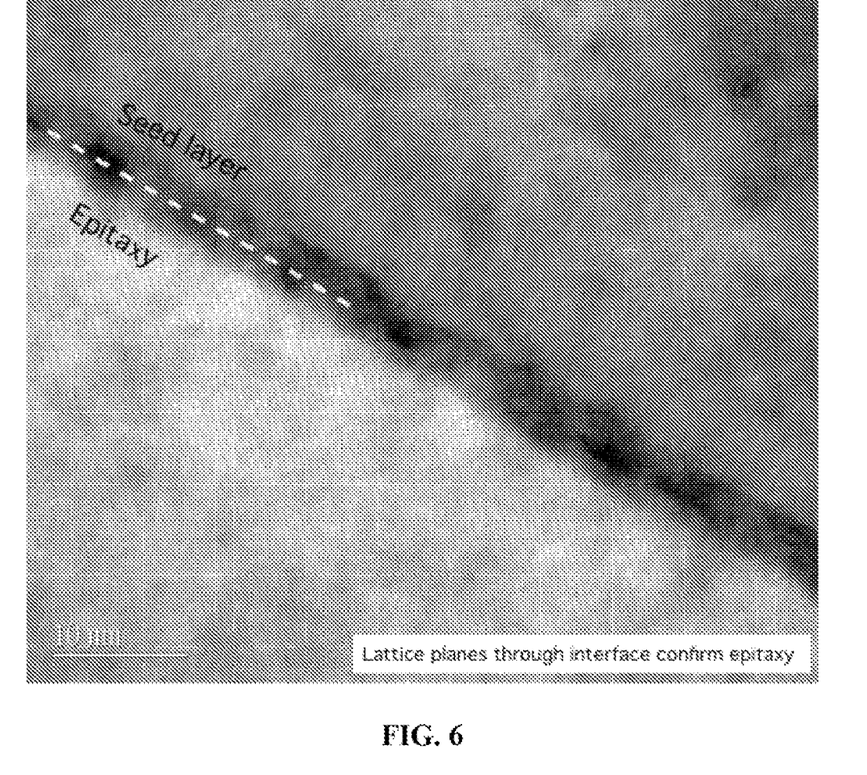
FIG. 6 shows by a TEM that epitaxy by a W (tungsten) hot filament process at about 650° C. thickened the crystalline layer on borosilicate glass in the process.
Figure 7:
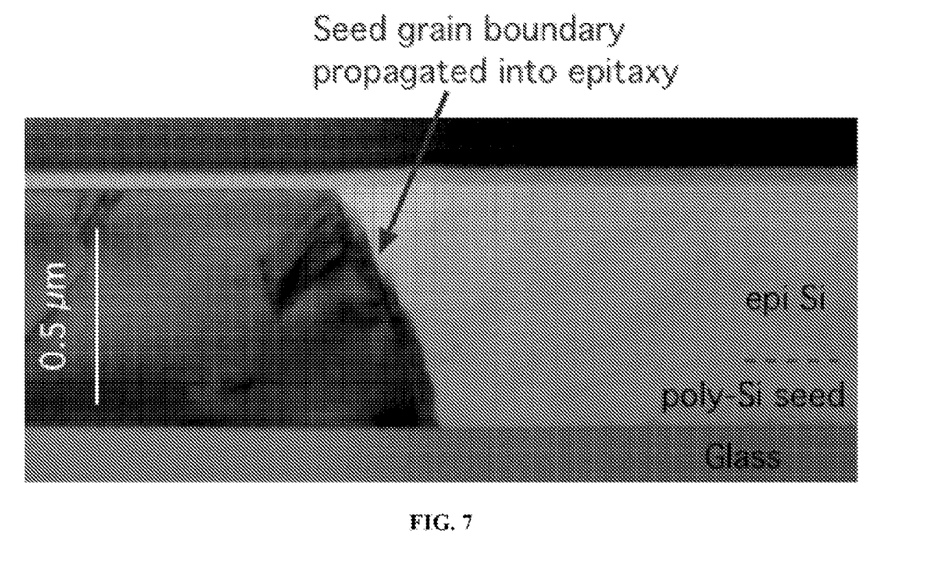
FIG. 7 shows that a single crystal epitaxy was obtained on each seed layer grain of the crystalline layer on borosilicate glass.

Additionally, because of the processing temperature of this method below 700° C., it is possible by this process to grow epitaxial crystalline Si on a thin crystalline seed layer on glass to any desired thickness. To illustrate the ability to grow epitaxially on seed crystalline Si layers on glass, FIG. 6 and FIG. 7 show the results of such growth at a temperature of about 650° C. on a thin seed layer of polycrystalline silicon on borosilicate glass. The TEM of FIG. 6 shows that a process using a W (tungsten) hot wire thickened crystalline layer in the process, where the epitaxial thickness was about 0.5 microns. A single crystal epitaxy was obtained on each seed layer grain, as shown in FIG. 7. This high resolution TEM shows that the lattice planes clearly extend through the interface, and selected electron diffraction measurements confirm that the epitaxial orientations are identical to the underlying seed crystal.

Previously published HWCVD epitaxy experiments were done at lower temperatures (<500° C.), see: C. Richardson, M. Mason and H. Atwater, *Thin Solid Films* 501, 332 (2006) and J. Dabrowski, H. Mussig and G. Wolff, *Phys. Rev. Lett.* 73, 1660 (1994). Despite the lower growth rates in these experiments, epitaxy failed through twinning or a transition to the amorphous phase after less than 1 micron of growth. At HWCVD conditions similar to those reported here (direct growth from pure silane, but at 12 nm/min with a Tanalum (Ta) filament), we found that the thickest epitaxy was achieved near 400° C. and that further increases in temperature to near 500° C. did not increase achievable maximum epitaxial thickness ($h_{epi}$), see: J. Dabrowski, H. Mussig and G. Wolff, *Phys. Rev. Lett.* 73, 1660 (1994). Our present data indicate that at deposition temperatures above 570° C. there is another growth regime where even thicker epitaxy is possible. It is known that the monohydride terminated silicon <100> surface is dehydrogenated in vacuum at 540° C., see: J. J. Boland, *Phys. Rev. B* 44, 1383 (1991), but this temperature may be somewhat higher in the H-rich atmosphere of silane HWCVD. Elimination of surface hydrogen coverage during growth may play a key role in successful hot-wire CVD epitaxy by preventing incorporation of surface H in the bulk as the film grows. If the growth surface loses H more rapidly than it is covered by fresh layers of Si, there is no possibility that H supersaturation will lead to breakdown, see: J. Thiesen, H. M. Branz and R. S. Crandall, *Appl. Phys. Lett.* 77, 3589 (2000).

Below 400° C., where the surface is dihydride terminated, see: J. Thiesen, H. M. Branz and R. S. Crandall, *Appl. Phys. Lett.* 77, 3589 (2000), CVD-grown epitaxy is limited to small thicknesses or extremely low deposition rates. At these low temperatures, H cannot escape fast enough, through either the film surface or the wafer substrate, and therefore builds up in the film. Epitaxy is thicker, but still not infinite at intermediate temperatures (400° C.-570° C.) where the surface is monohydride terminated and more hydrogen is able to escape. Finally, at high temperatures, essentially all of the hydrogen escapes from the growing silicon into the gas phase and the thickest epitaxy is possible. Of course, epitaxial thicknesses achieved will also depend on the deposition technique, gas chemistry, and especially the growth rate, which determines the rate that hydrogen must escape from the film to prevent supersaturation of the Si. Strain and defects in the epitaxial layer will also affect $h_{epi}$ by changing the rate at which hydrogen can diffuse through the bulk.

A similarity is noted between the temperature of 610° C.±15° C. required for thick epitaxy at our HWCVD growth rate of 110 nm/min and the temperature that would be required to achieve solid-phase epitaxial growth of amorphous silicon at the same rate. During solid-phase epitaxy at 610° C., the epitaxial growth rate (i.e., the rate at which the amorphous/crystalline interface moves from the substrate interface to the film surface) is 63 nm/min, see: J. Roth, G. Olson, D. Jacobson and J. Poate, *Appl. Phys. Lett.* 57, 1340 (1990). The solid phase epitaxy growth rate is a measure of the short-range diffusivity of Si atoms required for ordering the bulk. Any amorphous-like surface Si—Si bonds will have a high likelihood of converting to the lower-enthalpy bulk crystalline phase during epitaxial growth at 610° C. There would also be sufficient time to re-orient incipient polycrystalline phases at the surface before they incorporate in the bulk. This observation, together with the measured solid-phase epitaxy activation energy of about 2.7 eV, see: P. Stradins, Y. Yan, et al., *Amorphous and Polycrystalline Thin-Film Silicon Science and Technology*-2006. *Symposium* (*Materials Research Society Symposium Proceedings*) (*in press*), suggests that significantly higher HWCVD growth rates should be possible with moderate increases in substrate temperature.

From a technological perspective, the result demonstrates that HWCVD may be used to thicken c-Si seed layers for fabrication of thick Si devices. The growth rate used here is adequate for reasonable capital costs and the temperature is compatible with low-cost glasses. As an added advantage, the roughening that we observe in thicker films could be used to provide built-in haze for increasing the path length of weakly absorbed wavelengths in photovoltaic cells. Lastly, we note that we have explored the T-dependence of epitaxial growth for a very narrow set of deposition conditions—it is likely that the substrate temperature could be lowered, the growth rate could be increased, and the film defect density reduced by exploring a broader range of HWCVD deposition conditions.

It has been demonstrated growth of 11 microns of epitaxial silicon at 110 nm/min and 610° C. on <100> silicon wafers using hot-wire chemical vapor deposition. XRD analysis of films grown between 519° C. and 610° C. indicate that the phase of growth is very sensitive to the temperature in this range, likely due to reduced hydrogen incorporation above the transition to a H-free silicon surface. Additionally, we have found a transition to a rough epitaxial growth mode along <311> facets during growth of thick films (<4 µm) at 610° C. on <100> wafers, and report twinned epitaxial growth at 110 nm/min on <111>-oriented wafers at 645° C.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A method of producing epitaxial silicon films on a c-Si surface using hot wire chemical vapor deposition (HWCVD) by controlling rate of silicon deposition above temperature of dehydrogenation of the surface to obtain a phase-pure epitaxial silicon film, comprising:
   placing a sample with a c-Si surface within an orientation in a HWCVD reactor chamber;
   providing a deposition temperature above the monohydride to a silicon-free hydrogen surface transition temperature of about 570° C. to about 700° C.; and
   reacting a gas containing silicon on a hot filament at a sufficient rate to interact with said substrate to deposit a layer containing silicon thereon at a growth rate of about 110 nm/min to obtain a phase-pure epitaxial silicon film of increased thickness.

2. The method of claim 1 with a base pressure above $10^{-6}$ Torr.

3. The method of claim 1 wherein said deposition temperature is above 600° C.

4. The method of claim 3 wherein said rate of supplying said gas containing silicon is about 20 sccm.

5. The method of claim 4 wherein said increased thickness of pure epitaxial silicon film is up to about 11 µm.

6. The method of claim 1 wherein said c-Si wafer is (100) silicon.

7. The method of claim 6 wherein said deposition temperature range is sufficient to exceed the transition from a monohydride to a silicon-free hydrogen surface at about 570° C.

8. The method of claim 7 wherein said rate of supplying said gas containing silicon is about 20 sccm.

9. The method of claim 8 wherein said increased thickness of phase-pure epitaxial silicon film is up to about 11 µm.

10. The method of claim 1 wherein said c-Si surface consist of the (100), (111) and (311) faces of Si.

11. The method of claim 10 wherein said deposition temperature is above about 600° C.

12. The method of claim 11 wherein said rate of supply of said gas containing silicon is about 20 sccm.

13. The method of claim 12 wherein said increased thickness of phase-pure epitaxial silicon film is up to about 2 µm.

14. The method of claim 1 wherein said c-Si surface material is n-type.

15. The method of claim 14 wherein said n-type c-Si surface material is Sb dopant.

16. The method of claim 1 wherein said c-Si surface material is p-type.

17. The method of claim 16 wherein said p-type c-Si surface material is B dopant.

18. The method of claim 1 wherein said gas containing silicon has a component of $SiH_4$ molecules.

19. The method of claim 1 wherein an epitaxial silicon film up to 11 µm on a c-Si wafer (100) silicon is produced.

20. The method of claim 1 wherein an epitaxial silicon film up to 20 µm on a c-Si wafer (111) silicon is produced.

21. The method of claim 1 wherein the c-Si surface is a surface of single crystal Si.

22. The method of claim 1 wherein the c-Si surface is a surface of polycrystalline Si wafers.

23. The method of claim 1 wherein the c-Si surface is a surface of polycrystalline Si films or polycrystalline Si films on a Si substrate.

24. The method of claim 1 that produces an uneven surface and reduces reflectivity and increases light absorption in the epitaxy layer.

25. A method of producing epitaxial silicon films on a c-Si surface that is a thin Si layer on glass using hot wire chemical vapor deposition (HWCVD) by controlling the rate of silicon deposition above the temperature of dehydrogeneration of the surface to obtain phase-pure epitaxial silicon film, comprising:

placing a sample with a c-Si surface of some orientation as a thin Si layer on glass in a HWCVD reactor chamber;

providing a deposition temperature above the monohydride to a silicon-free hydrogen surface transition temperature of about 570° C. to about 700° C.;

reacting a gas containing silicon on the hot filament at a sufficient rate to interact with said thin Si layer substrate to deposit a layer containing silicon thereon at a growth rate of about 110 nm/min to obtain phase-pure epitaxial silicon film of increased thickness.

26. The method of claim 25 wherein said glass is borosilicate glass and the seed layer obtained is about 200 nm.

* * * * *